United States Patent [19]

Hasegawa et al.

[11] Patent Number: 4,935,625
[45] Date of Patent: Jun. 19, 1990

[54] ELECTRON HOLOGRAPHY APPARATUS

[75] Inventors: Shuji Hasegawa; Junji Endo, both of Kokubunji; Nobuyuki Osakabe, Kodaira; Akira Tonomura, Koganei, all of Japan

[73] Assignee: Hitachi, Ltd., Tokyo, Japan

[21] Appl. No.: 238,143

[22] Filed: Aug. 30, 1988

[30] Foreign Application Priority Data

Sep. 4, 1987 [JP] Japan .................. 62-220228

[51] Int. Cl.⁵ .............................. H01J 37/26
[52] U.S. Cl. ............................ 250/306; 250/311
[58] Field of Search .......................... 250/306, 311

[56] References Cited

U.S. PATENT DOCUMENTS 4,109,996  8/1978  Ersoy ............................. 250/306
4,532,422  7/1985  Nomura et al. .................. 250/306
4,748,132  5/1988  Fukuzawa et al. ............. 250/492.3

OTHER PUBLICATIONS

"Significance of Electronmagnetic Potentials in the Quantum Theory", Aharonov et al., *The Physical Review*, vol. 115, No. 3, pp. 485-491, Aug. '59.
"Quantitative Phase Analysis in Electron Holographics Interferometry", Yatasai et al., *Applied Optics*, vol. 26, No. 2, Jan. 1987, pp. 377-382.
"Interference Electron Microscopy by Means of Holography", Endo et al., *Jap. Journ. of Applied Physics*, vol. 8, No. 12, Dec. 1979, pp. 2291-2294.
*Applications of Electron Holography*, by Akira Tonomura.

*Primary Examiner*—Bruce C. Anderson
*Attorney, Agent, or Firm*—Antonelli, Terry, Stout & Kraus

[57] ABSTRACT

An electron holography apparatus includes an electron microscope which is provided with an electron source, a beam splitter for dividing an electron beam emitted from the electron source into first and second electron beams, and a phase controller for controllably changing a phase difference between the first and second electron beams, and further includes an image detector for detecting an electron interference fringe pattern which varies in accordance with the phase difference between the first and second electron beams, as a picture image, and an image data processor for determining the phase distribution of one of the first and second electron beams from detected image data.

9 Claims, 8 Drawing Sheets

F I G. 1
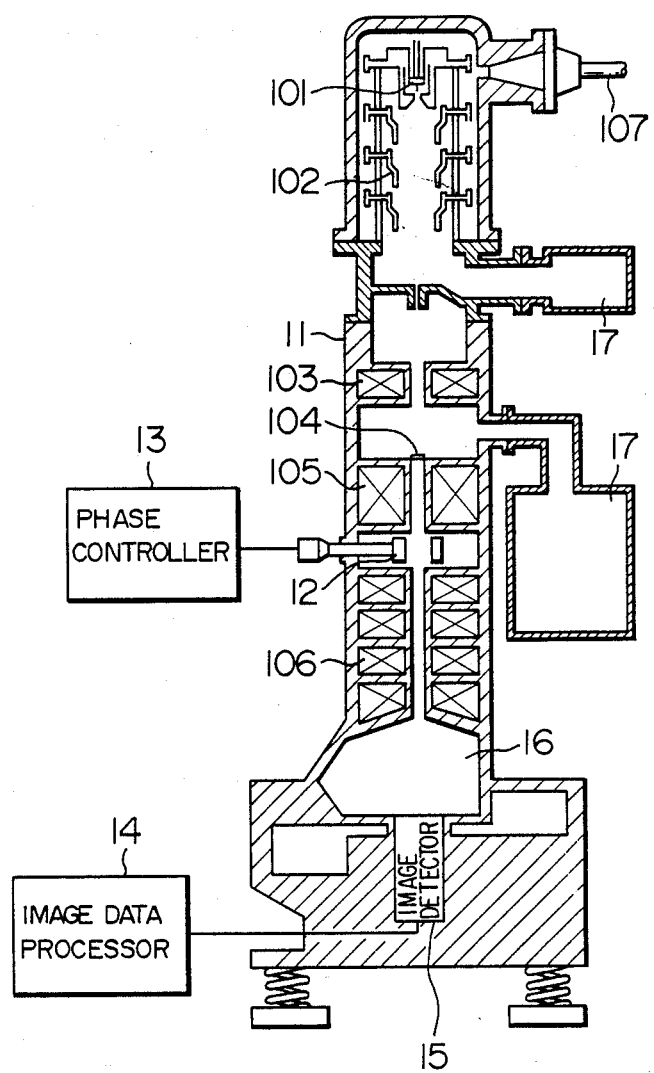

ELECTRON HOLOGRAPHY APPARATUS

BACKGROUND OF THE INVENTION

The present invention relates to electron holography apparatuses, and more particularly to an electron holography apparatus which can three-dimensionally measure the phase distribution of an electron beam precisely and rapidly.

FIG. 10 schematically shows a hologram formed by off-axis electron holography which uses an electron microscope provided with an electron biprism (that is, an electron beam splitter). The hologram consists of equally spaced fringes called carrier fringes. However, the phase of an electron beam is varied by the presence of a specimen, an electric field, or a magnetic field, and hence the portion of the interference fringe pattern 1 which corresponds to the above factors deviates from the carrier fringes. The deviation is proportional to a change in phase of the electron beam. Accordingly, a phase distribution map of the electron beam can be formed by detecting the deviation of the interference fringes from the carrier fringes.

Hence, the following method has been used to obtain the phase distribution map. That is, as described in U.S. Pat. No. 4,532,422, a basic, straight fringe pattern having the same spatial frequency as the carrier fringes of the hologram is superposed on the hologram to obtain visual equi-phase lines on the basis of the Moiré principle. Thus, the phase distribution is expressed by equi-phase lines which are formed at a phase interval of $2\pi$. In order to improve the precision of the phase distribution measurement, it is required to form one or more equi-phase lines between adjacent Moiré fringes by an appropriate interpolation method. However, it is very difficult to obtain an accurate phase distribution map in such a manner. This is because the brightness distribution in the interference fringe pattern is affected not only by the phase distribution of the electron beam but also by the amplitude distribution thereof, and thus the phase distribution does not necessarily correspond to the brightness distribution in the interference fringe pattern. Further, in this method, basic, straight fringes are left unremoved, in addition to the Moiré fringes, and act as noise.

Another method of determining the phase distribution of an electron beam uses an optical interferometer, as shown in FIG. 1 of an article entitled "Interference Electron Microscopy by Means of Holography" by J. Endo et al. (Japanese Journal of Applied Physics, Vol. 18, No. 12, December, 1979, pages 2291 to 2294). In this method, the basic straight fringes do not appear, but the phase distribution is expressed by the equi-phase lines. Further, a method of measuring the phase distribution of an electron beam so that a phase difference less than $2\pi$ can be detected, is known. As shown in FIG. 5 of the above-mentioned article and the explanation of FIG. 5, this method uses phase-difference-amplification techniques. However, the method requires not only a great deal of skill but also much labor and time, and the precision of measurement of phase distribution is limited to about $2\pi/50$. This value is not satisfactory.

As mentioned above, the conventional methods can not satisfy three important requirements (that is, the high-precision measurement of phase distribution, the high-speed measurement of phase distribution, and the acquisition of three-dimensional information on phase distribution, that is, phase information capable of discriminating between lead and lag with respect to phase) at the same time.

SUMMARY OF THE INVENTION

It is accordingly an objective of the present invention to provide an electron holography apparatus which can three-dimensionally measure the phase distribution of an electron beam with high precision and at high speed to satisfy the above-mentioned three requirements at the same time.

In order to attain the above-mentioned objective, according to the present invention, there is provided an electron holography apparatus which comprises: an electron microscope provided with an electron source, a beam splitter for dividing an electron beam emitted from the electron source into first and second electron beams, and a phase controller for controllably changing a phase difference between the first and second electron beams; an image detector for detecting an electron interference fringe pattern as a picture image, the electron interference fringe pattern varying in accordance with the phase difference between the first and second electron beams; and an image data processor for determining the phase distribution of one of the first and second electron beams from detected image data.

In an electron holography apparatus according to the present invention, in order to satisfy the above-mentioned three requirements at the same time, the fringe scanning interferometry which is widely used in the field of optics is applied to an electron beam by utilizing the Aharonov-Bohm effect described in the Physical Review, Second Series, Vol. 115, No. 3, 1959, pages 485 to 491.

As is evident from the section III (Phase Analysis) of an article entitled "Quantitative phase analysis in electron holographic interferometry" by T. Yatagai et al. (APPLIED OPTICS, Vo. 26, No. 2, 1987, pages 377 to 382), the term "fringe scanning interferometry" means a method of determining phase distribution in the following manner. In a case where two light waves (that is, an object wave and a reference wave) are superposed on each other to obtain an interference fringe pattern, each of a plurality of reference waves different in phase from each other is superposed on the object wave to form a plurality of interference fringe patterns, and the phase distribution of the object wave is determined from the interference fringe patterns by using Fourier coefficients.

In the case of light, the phase of the reference wave can be readily controlled by varying an optical path length, and hence the fringe scanning interferometry can be readily carried out. For two electron beams corresponding to the object and reference waves, it is known that the phase difference between the electron beams can be controlled by varying the amount of a magnetic flux which passes through a space enclosed by the electron beams, or by accelerating and decelerating the electron beams by an electric field. This phenomenon is called the Aharonov-Bohm effect. In the present invention, the fringe scanning interferometry is carried out in an electron microscope by utilizing the Aharonov-Bohm effect, to determine the phase distribution of an electron beam serving as an object wave.

The principle of the present invention will now be explained below in more detail.

An electron beam emitted from an electron gun is divided by an electron beam splitter into two electron beams, one of which impinges on a specimen, to be used as an object beam having information thereon. The other electron beam passes through a space where the specimen is absent, to be used as a reference beam. The object and reference beams are superposed so as to interfere with each other, and thus an electron hologram as shown in FIG. 10 is obtained.

The brightness distribution I(x,y,Δϕ) of the electron hologram shown in FIG. 10 is generally given by the following equation:

$$I(x,y,\Delta\phi) = a(x,y) + b(x,y) \cdot \cos[\phi(x,y) + 2\pi f x + \Delta\phi] \quad (1)$$

where $\phi(x,y)$ indicates the phase distribution of the object beam, $\alpha\phi$ the base difference between the object beam and the reference beam, and f the spatial frequency of carrier fringes. The second term of the right-hand side of the equation (1) indicates the brightness distribution of the interference fringes, and the first term of the right-hand side indicates the background. When the value of the phase difference $\Delta\phi$ is changed by a phase controller for controlling the phase difference between the reference beam and the object beam, an interference fringe pattern is changed. The brightness distribution of each pattern is detected by two dimensionally arranged pixels, and manipulated as follows to obtain the phase distribution. The value of $\Delta\phi$ is changed in a range from zero to $2\pi$ in such a manner that the phase difference $\Delta\phi$ is set to each of n discrete values $\Delta\phi_1, \Delta\phi_2, \ldots \Delta\phi_n$. The phase of the point (x,y) can be calculated from the n brightness values I(x,y,$\Delta\phi_i$) (i=1, ..., n) in a similar manner to the optical fringe scanning interferometry described in the sub-section B (Algorithm) of the section III of the above-referred article (APPLIED OPTICS, Vol. 26, No. 2, 1987, pages 377 to 382). Thus the phase distribution is obtained by performing the above procedure with respect to all the pixels.

Three methods can be used to control the phase difference $\Delta\phi$ between the object beam and the reference beam.

In a first one of the three methods, as shown in FIG. 2A, a fine magnetic-field generator (for example, an electromagnetic coil, a magnetic body, or a magnetic circuit) is disposed within a space enclosed by an object beam 6 which is emitted from an electron source 3 and passes through a specimen 4, and a reference beam 5 emitted from the electron source 3 so that a magnetic flux 7 having the amount Φ of a magnetic flux (hereinafter referred to as a magnetic flux Φ) is formed in a direction perpendicular to the paper showing FIGS. 2A to 2C. In this case, the phase difference $\Delta\phi$ between the object beam 6 and the reference beam 5 is given by the following equation:

$$\Delta\phi = -e\Phi/h \quad (2)$$

where e indicates the electron charge, and h is a constant obtained by dividing Planck's constant h by $2\pi$. Thus, the phase difference $\Delta\phi$ can be set to a desired value by changing the magnetic flux Φ by means of the magnetic-field generator.

In a second method, as shown in FIG. 2B, an electrostatic phase shifter 9 is disposed on the path of an electron beam, to form a space which has a length L and is different in electric potential from a surrounding space. When the electron beam is accelerated and decelerated by the phase shifter 9, the phase of the electron beam is changed by an amount $\Delta\phi$, which is given by the following equation:

$$\Delta\phi = \pi V_o \cdot L / (E \cdot \lambda) \quad (3)$$

where $V_o$ indicates a mean potential within the electrostatic phase shifter 9, E an accelerating voltage applied to the electron beam, and λ the wavelength of the electron beam. Accordingly, the phase difference $\Delta\phi$ between the reference beam 5 and the object beam 6 can be set to a desired value by disposing the electrostatic phase shifter 9 on one or both of the path of the reference beam 5 and the path of the object beam 6, and by changing the mean potential $V_o$ within the phase shifter 9.

In a third method, as shown in FIG. 2C, a body 10 having a thickness L and a mean inner potential $V_o$ is disposed on the path of an electron beam to be used as a phase plate. In this case, the phase of the electron beam varies from an original value by an amount $\Delta\phi$ given by the equation (3). Accordingly, the phase difference $\Delta\phi$ between the reference beam 5 and the object beam 6 can be set to a desired value by disposing the phase plate 10 on one or both of the path of the reference beam 5 and the path of the object beam 6, and by changing the thickness of the phase plate or changing the mean inner potential $V_o$ in such a manner that the material of the phase plate is changed.

BRIEF DESCRIPTION OF THE DRAWINGS

FIG. 1 is a partial sectional diagram of an embodiment of an electron holography apparatus according to the present invention.

DESCRIPTION OF THE PREFERRED EMBODIMENTS

Now, the preferred embodiments of the present invention will be explained below, with reference to the drawings.

Figure 2A:
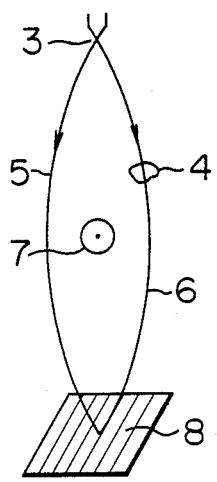
FIGS. 2A to 2C are schematic diagrams showing electron holography apparatuses utilizing the fringe scanning interferometry, the apparatuses using magnetic flux, an electrostatic phase shifter, and a phase plate, respectively, to control the phase of an electron beam.

FIG. 1 shows an embodiment of an electron holography apparatus according to the present invention including a phase controller for controlling the phase of an electron beam by a magnetic flux as shown in FIG. 2A. The present embodiment operates as follows. An electron beam emitted from an electron source 101 is accelerated by an accelerator 102 so as to have a kinetic energy of tens to hundreds of kilo-electron volts. The accelerated electron beam passes through a condenser lens 103. A part of the electron beam emerging from the condenser lens 103 passes through a specimen 104 to form an object beam. The remaining part of the electron beam not incident on the specimen forms a reference beam. The object beam transmitted through the specimen 104 passes through an objective lens 105 and then travels, for example, on the right side of an electron biprism wire, and passes through a magnifying lens 106 to form an enlarged image of the specimen on an image detector 15. For example, the image detector 15 is made up of a fluorescent screen for converting an electron beam into light and a television camera for detecting an image on the fluorescent screen.

The reference beam -O- which is not incident on the specimen, travels on the left side of the electron biprism wire, and then falls on the enlarged image of the specimen formed on the image detector 105, that is, the reference beam interferes with the object beam to form interference fringes. The phase difference between the object beam traveling on the right side of the electron biprism wire and the reference beam traveling on the left side of the electron biprism wire is changed by a phase controller 13 connected to an electron biprism 12. A plurality of interference fringe patterns are formed by changing the phase difference between the object beam and the reference beam. The interference fringe patterns thus formed are detected by the image detector, and image data with respect to the interference fringe patterns is sent to an image data processor 14, to determine the phase distribution of the object beam.

As mentioned above, according to the present embodiment, an electron microscope 11 is provided with the electron biprism 12 serving as an electron beam splitter and the phase controller 13 for changing the phase difference between the object beam and the reference beam on the basis of a change in magnetic field intensity. Further, an interference fringe pattern formed in an observation chamber 16 of the electron microscope 11 is detected by the image detector 15, and image data with respect to the detected interference fringe pattern is processed by the image data processor 14 to determine the phase distribution of the object beam.

Figure 3:
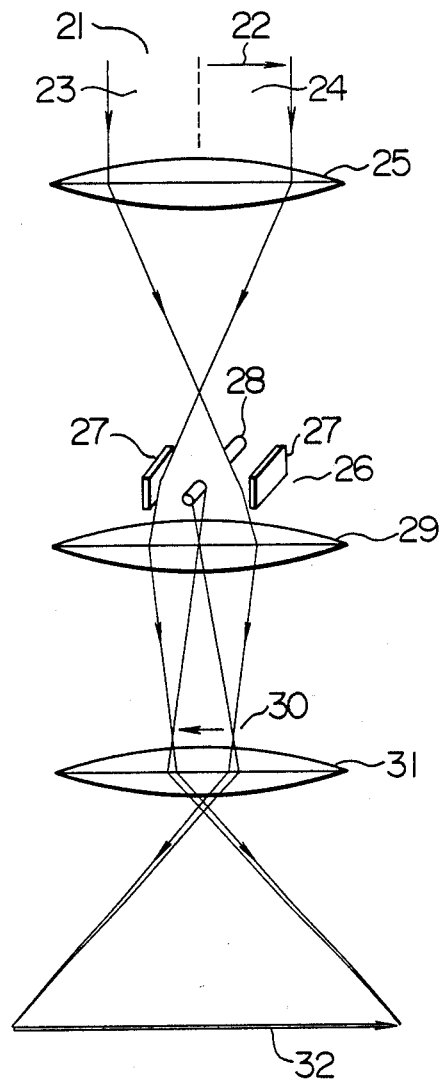
FIG. 3 is a schematic diagram showing an example of an electron-optical system used in an electron holography apparatus.

FIG. 3 shows an example of an electron-optical system used in an electron holography apparatus. Referring to FIG. 3, only a part of an incident electron beam 21 passes through a specimen 22, to form an object beam 24. The remaining part of the incident electron beam 21 acts as a reference beam 23. The object beam 24 and the reference beam 23 are superposed on each other with the aid of an electron biprism 26, to form interference fringes. The interference fringe pattern thus obtained is enlarged by a projection lens 31, together with a real image 30 of the specimen 22 formed by an objective lens 25 and an intermediate lens 29, to form electron interference fringes (namely, an electron hologram) 32. The electron biprism 26 is made up of a pair of electrodes 27 which are grounded, and a thin wire 28 which lies midway between the electrodes and is applied with a positive potential. Owing to the positive potential of the thin wire, an electron beam traveling on the left side of the thin wire and another electron beam traveling on the right side of the thin wire are attracted to each other, and thus are superposed on each other.

Figure 4A:
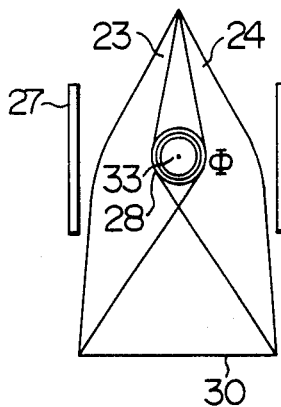
FIG. 4A is a schematic diagram showing an electron-optical system, in which the magnetic flux for controlling the phase of an electron beam is generated within the electron biprism wire of FIG. 3.
Figure 4B:
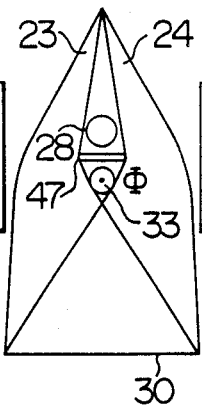
FIG. 4B is a schematic diagram showing an electron-optical system, in which the magnetic flux for controlling the phase of an electron beam is generated under the electron biprism wire of FIG. 3.
Figure 4C:
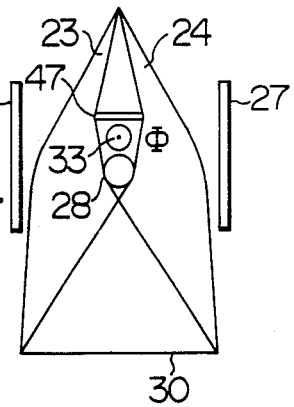
FIG. 4C is a schematic diagram showing an electron-optical system, in which the magnetic flux for controlling the phase of an electron beam is generated over the electron biprism wire of FIG. 3.
Figure 5A:
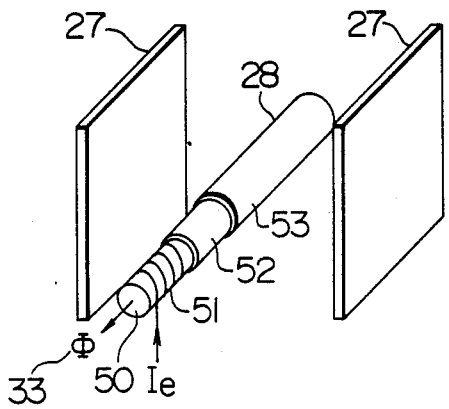
FIG. 5A is a perspective view showing a phase controller, in which the magnetic flux for controlling the phase of an electron beam is generated by an electromagnetic coil provided within the electron biprism wire of FIG. 3.
Figure 5B:
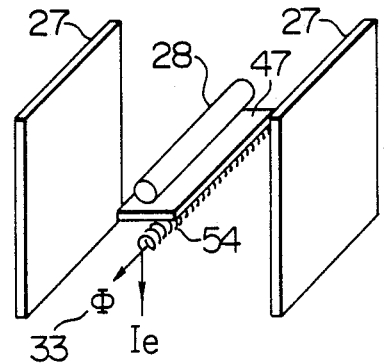
FIG. 5B is a perspective view showing a phase controller, in which the magnetic flux for controlling the phase of an electron beam is generated by an electromagnetic coil disposed under the electron biprism wire of FIG. 3.
Figure 6:
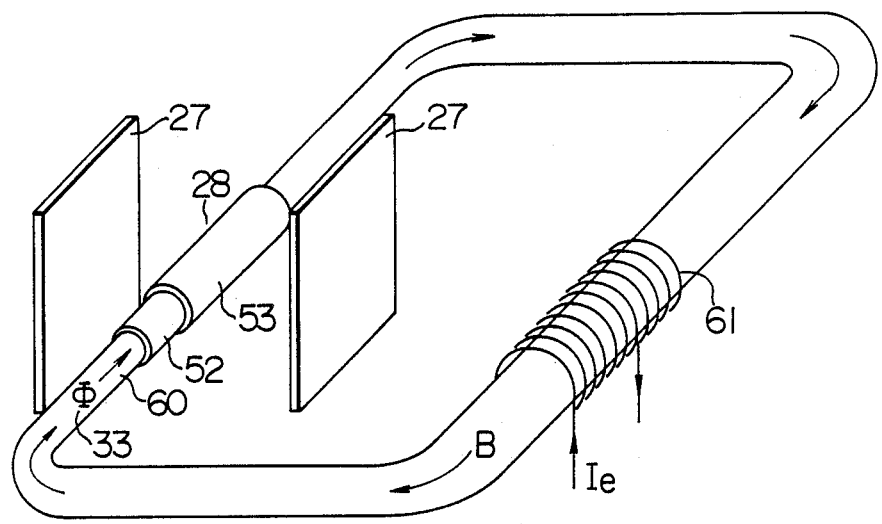
FIG. 6 is a perspective view showing a phase controller, in which the magnetic flux for controlling the phase of an electron beam is generated within the electron biprism of FIG. 3 by a closed magnetic circuit.
Figure 10:
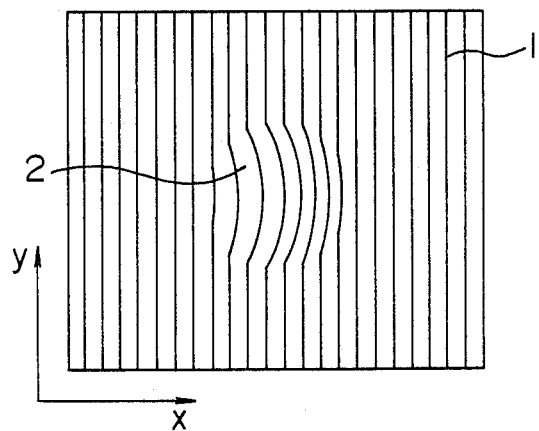
FIG. 10 is a schematic diagram showing an electron hologram.

An electromagnetic coil for generating a magnetic flux $\Phi$ can be disposed at various positions. The electromagnetic coil may be disposed within an electron biprism wire 28 as shown in FIG. 4A. Alternatively, the electromagnetic coil may be disposed under the biprism wire 28 as shown in FIG. 4B, or may be disposed over the biprism wire 28 as shown in FIG. 4C. FIG. 5A shows the detailed structure of an example of the phase controller. In this example, a magnetic flux $\Phi$ is formed within the electron biprism wire 28. As shown in FIG. 5A, an electromagnetic coil 51 wound around an insulating core 50 or an air core coil is covered by a metal tube 53 through an insulating material 52 or an air gap. The metal tube 53 is applied with a positive potential to serve as the electron biprism wire 28. When a current flows through the coil 51, a magnetic flux $\Phi$ is formed in the coil 51. FIG. 5B shows another example of the phase controller. In this example, a shielding plate 47 is disposed under the electron biprism wire 28, and an electromagnetic coil 54 for generating a magnetic flux $\Phi$ therein is disposed under the shielding plate 47. In this arrangement, it is not always required to interpose the shielding plate 47 between the biprism wire 28 and the coil 54. Further, an actual structure corresponding to FIG. 4C can be readily formed in a manner similar to that shown in FIG. 5B. A magnetic wire magnetized in the axial direction of the electron biprism wire 28 may be used in place of the coil 54, to form a magnetic flux $\Phi$. Further, as shown in FIG. 6, a magnetic circuit which includes a core 60 penetrating the electron biprism wire 28, may be used for generating the magnetic flux $\Phi$. In this case, the magnetic flux $\Phi$ can pass through the biprism wire 28 in a state that an electromagnetic coil 61 is disposed outside of the electron biprism. The magnetic circuit of FIG. 6 is also applicable to a case where the magnetic flux $\Phi$ is formed over or under the biprism wire 28.

Figure 2B:
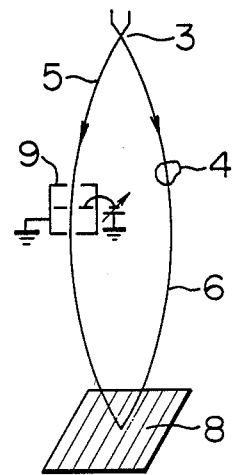
Figure 7:
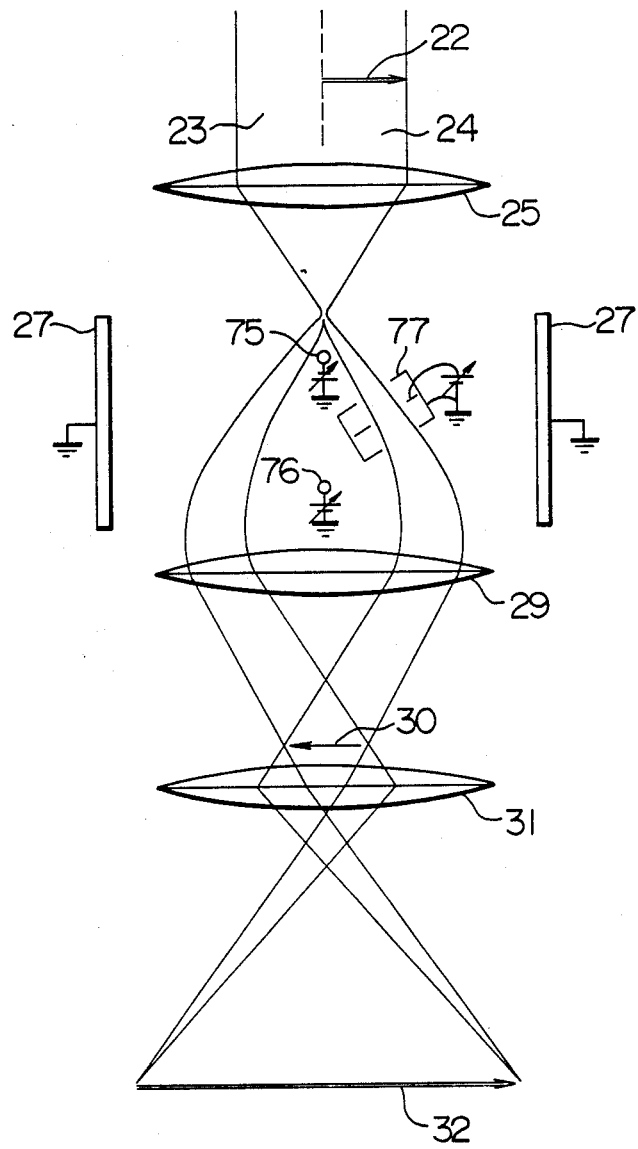
FIG. 7 is a schematic diagram showing the electron-optical system of another embodiment of an electron holography apparatus according to the present invention, in which an electrostatic phase shifter is used for controlling the phase of an electron beam.

FIG. 7 shows another embodiment of an electron holography apparatus according to the present invention in which the phase controller includes the electrostatic phase shifter shown in FIG. 2B. In the present embodiment, as shown in FIG. 7, the object beam 24 and the reference beam 23 are completely separated by an electron biprism which includes a biprism wire 75 applied with a negative potential and another biprism wire 76 applied with a positive potential. The reference beam 23 separated from the object beam 24 passes through an electrostatic phase shifter 77. Thus, the phase of the reference beam 23 is controlled by the phase shifter 77. Alternatively, the reference beam 23 and the object beam 24 may pass through first and second electrostatic phase shifters, respectively. In this case, it is necessary to make the voltages applied to the first and second phase shifters different from each other so that a phase difference is produced between the reference beam and the object beam.

Figure 2C:
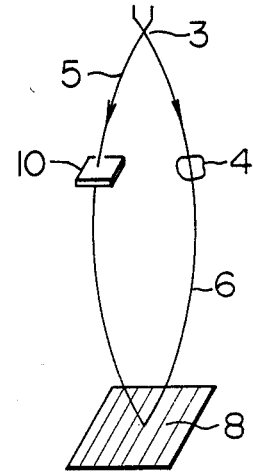
Figure 8:
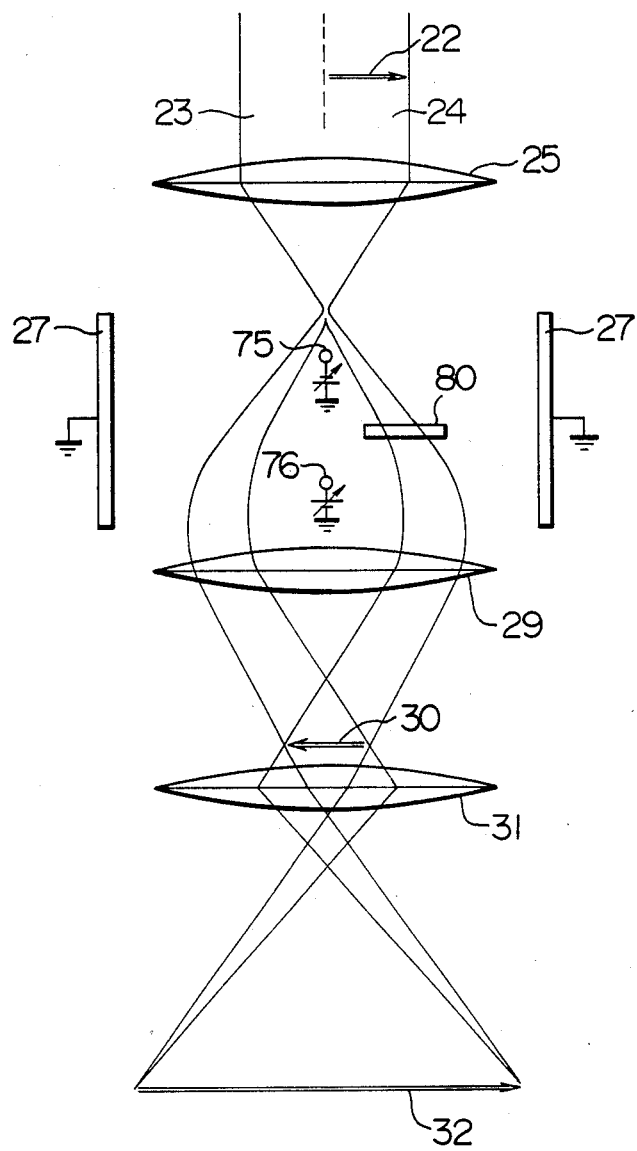
FIGS. 8 and 9 are schematic diagrams showing two examples of the electron-optical system of a further embodiment of an electron holography apparatus according to the present invention in which a phase plate is used for controlling the phase of an electron beam.
Figure 9:
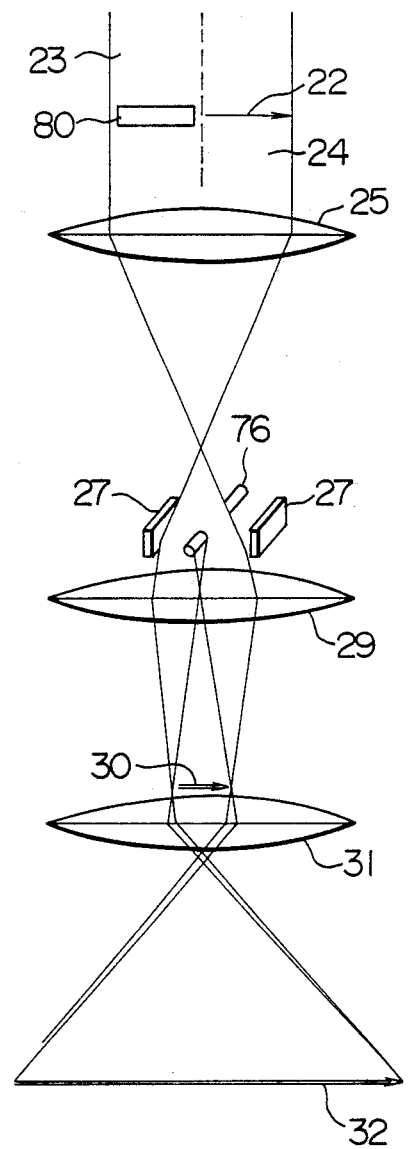

FIGS. 8 and 9 show a further embodiment of an electron holography apparatus according to the present invention in which the phase plate shown in FIG. 2 is used as the phase controller. In the arrangement of FIG. 8, the object beam 24 and the reference beam 23 are completely separated by the electron biprism which includes the wire 75 applied with a negative potential and the wire 76 applied with a positive potential, as in the embodiment of FIG. 7. Only the reference beam 23 separated from the object beam 24 passes through a phase plate 80. In the arrangement of FIG. 9, an electron biprism includes only the biprism wire 76 applied with a positive potential, and the phase plate 80 is disposed on the reference wave side at the same height as the specimen 22. The phase plate 80 may be disposed at any position in the electron-optical system of FIG. 9, provided that only the reference beam passes through the phase plate.

In a case where a phase plate is used as the phase controller, the object beam and the reference beam may pass through first and second phase plates which are different in thickness or material from each other, respectively, to produce a phase difference between the object beam and the reference beam.

Further, in a case where a magnetic flux Φ passes through a space enclosed by the object beam and the reference beam to produce a phase difference between the object beam and the reference beam, the same electron biprism as shown in FIGS. 7 and 8 (that is, an electron biprism including a positive-potential wire and a negative-potential wire) may be used in place of the electron biprism shown in FIG. 3.

As has been explained in the foregoing, an electron holography apparatus according to the present invention can three-dimensionally measure the phase distribution of the electron beam having passed through a specimen, and moreover the precision of measurement can be improved by about one order of magnitude, as compared with the precision of phase measurement in a case where the phase-difference-amplification techniques utilizing photography are used for measuring the phase distribution of an electron beam. Further, the time necessary for measurement can be made less than one-tenth of the a measuring time in the above case.

We claim:

1. An electron holography apparatus comprising:
   an electron microscope provided with an electron source, a beam splitter for dividing an electron beam emitted from the electron source into first and second electron beams, and a phase controller for controllably changing a phase difference between the first and second electron beams;
   an image detector for detecting an electron interference fringe pattern as a picture image, the electron interference fringe pattern varying in accordance with the phase difference between the first and second electron beams;
   an image data processor for determining the phase distribution of one of the first and second electron beams from detected image data;
   wherein the phase controller includes electric-field generating means for controlling the velocity of at least one of the first and second electron beams, to control the phase difference between the first and second electron beams.

2. An electron holography apparatus comprising:
   an electron microscope provided with an electron source, a beam splitter for dividing an electron beam emitted from the electron source into first and second electron beams, and a phase controller for controllably changing a phase difference between the first and second electron beams;
   an image detector for detecting an electron interference fringe pattern as a picture image, the electron interference fringe pattern varying in accordance with the phase difference between the first and second electron beams;
   an image data processor for determining the phase distribution of one of the first and second electron beams from detected image data;
   wherein the phase controller includes a body serving as a phase shifter, in such a manner that at least one of the first and second electron beams passes through the body, to control the phase difference between the first and second electron beams.

3. An electron holography apparatus comprising:
   an electron source;
   a beam splitter for dividing an electron beam emitted from said electron source into first and second electron beams;
   a phase controller for stepwise changing a relative phase difference between the first and second electron beams into a plurality of values;
   an electron biprism for superposing the first and second electron beams on each other to form an electron interference fringe pattern;
   an image detector for detecting in a time series a plurality of electron interference fringe patterns, which are obtained in the time series according to said plurality of phase difference values, as respective image data; and
   an image data processor for determining a phase distribution of at least one of the first and second beams from the image data corresponding to the plurality of electron interference fringe patterns.

4. An electron holography apparatus according to claim 3, wherein the phase controller includes electric-field generating means for controlling the velocity of at least one of the first and second electron beams to control the phase difference between the first and second electron beams.

5. An electron holography apparatus according to claim 3, wherein the phase controller includes a body serving as a phase shifter, in such a manner that at least one of the first and second electron beams passes through the body to control the phase difference between the first and second electron beams.

6. An electron holography apparatus according to claim 3, wherein the phase controller includes magnetic-field generating means for generating a magnetic flux so that the magnetic flux passes through a space formed between the first and second electron beams, to control the phase difference between the first and second electron beams by changing the intensity of the magnetic flux.

7. An electron holography apparatus according to claim 6, wherein the magnetic-field generating means comprises an electromagnetic coil.

8. An electron holography apparatus according to claim 6, wherein the magnetic-field generating means comprises a magnetic substance.

9. An electron holography apparatus according to claim 6, wherein the magnetic-field generating means includes a closed magnetic circuit made of a magnetic material, and an electromagnetic coil for generating the magnetic flux all over the closed magnetic circuit.

* * * * *